United States Patent [19]
Watson

[11] 3,748,728
[45] July 31, 1973

[54] METHOD OF MAKING GRANULAR SUPERCONDUCTORS

[75] Inventor: James H. P. Watson, Corning, N.Y.
[73] Assignee: Corning Glass Works, Corning, N.Y.

[22] Filed: Oct. 22, 1971
[21] Appl. No.: 191,744

Related U.S. Application Data
[62] Division of Ser. No. 27,564, April 13, 1970, Pat. No. 3,650,991.

[52] U.S. Cl. .................... 29/599, 29/183.5, 29/194, 174/DIG. 6
[51] Int. Cl. .................... H01v 11/00
[58] Field of Search .................... 29/599, 183.5, 194, 29/199; 174/126 CP, DIG. 6; 252/500, 512, 518, 455

[56] References Cited
UNITED STATES PATENTS
3,214,249 10/1965 Bean et al. .................... 29/180
3,301,643 1/1967 Cannon et al. .................... 29/195
3,509,071 4/1970 Goldstein .................... 252/455 Z

*Primary Examiner*—Charles W. Lanham
*Assistant Examiner*—D. C. Reiley, III
*Attorney*—Clarence R. Patty, Jr., William J. Simmons et al.

[57] ABSTRACT

Disclosed is a method of forming a composite superconductive body comprising a porous glass matrix having a granular system of superconductive material disposed within the pores thereof. Adjacent grains of supercondcutive material are spatially separated but are electrically connected by electron tunneling. The critical field of these granular superconductors can be modified by processing either the porous glass matrix or the molten superconductor prior to impregnation of the superconductive material into the matrix.

5 Claims, 1 Drawing Figure

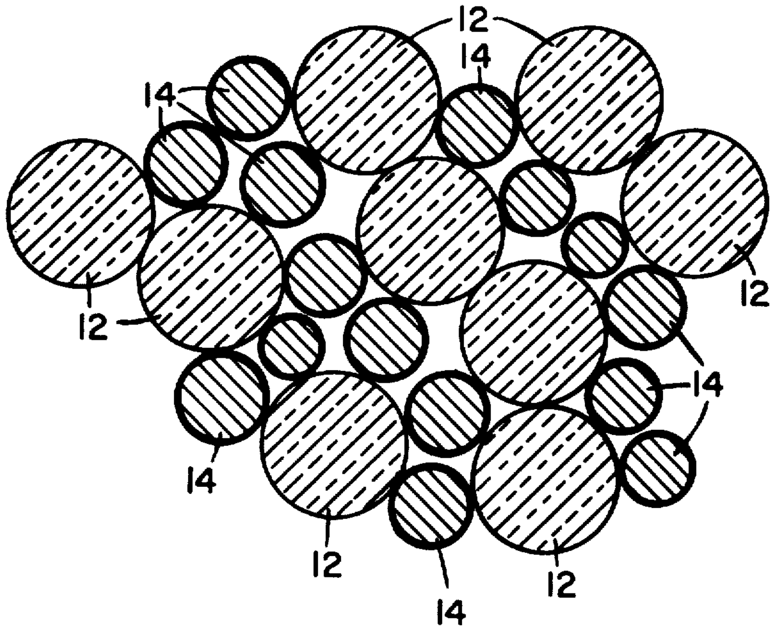
INVENTOR.
James H.P. Watson
BY William J Simmons Jr
ATTORNEY

METHOD OF MAKING GRANULAR SUPERCONDUCTORS

CROSS REFERENCE TO RELATED APPLICATION

This is a division of application Ser. No. 27,564 filed Apr. 13, 1970, now Pat. No. 3,650,991.

BACKGROUND OF THE INVENTION

This invention relates to a method of forming a composite superconductive body comprising a non-superconductive matrix having a granular system of superconductive material disposed within the pores of the matrix. The term "granular" as used herein refers to grains of superconductive material that are spatially separated but which are electrically connected by electron tunneling. In accordance with this invention the composite superconductive body can be formed in such a manner as to modify the electron tunneling barriers between adajcent grains.

It is well known that certain metals, alloys and compounds go through a superconducting transition into a state in which the electrical resistance has a value of zero at temperatures approaching absolute zero. The transition temperature, $T_c$, is that temperature at which a superconductive material becomes superconducting. By subjecting a superconductive material to a magnetic field, the current induced therein will theoretically continue for an infinite time, as long as the temperature of the material remains below $T_c$, and the field is below a critical field, $H_c$. The critical field is a function of $T_c$, and it becomes greater as $T_c$ decreases.

Since superconductive devices such as magnetic coils, wires, circuits and the like usually encounter high magnetic fields during use, it is desirable that $H_c$ be as high as possible. For obvious reasons, it is also desirable that $T_c$ be high. In the manufacture and utilization of superconductive devices, the above aspects of the phenomenon of superconductivity must be considered. For example, in producing superconductive magnetic coils, a superconductive material is selected which will provide a high critical field. When such a coil is in use, the field to which the coil is subjected must remain below $H_c$.

The particular physical form of the superconductor as well as the composition thereof has a large effect on the superconducting properties, especially the critical field. Some superconducting compounds exhibit a relatively high critical field due to the fact that such compounds contain interconnected filaments of superconducting material which can be likened to a sponge, the filaments of superconducting material being separated by non-superconducting metal. It is theorized that the amount of "frozen in" flux depends mainly on the purity of the superconductor, and the amount of "freezing in" increases with the addition of the non-superconducting metal. Parts of a specimen become more easily superconductive when alloys are formed with a second component or with an impurity. It is thought that "rings" of superconductive material formed in these regions exhibit a higher critical field and are responsible for the "freezing in." If an appreciable portion of the magnetic field is trapped within the material the superconductor is called "hard." This is distinguished from the case wherein the magnetic field is substantially all expelled, in which case the superconductor is called "soft," a term which originally referred principally to the physical properties of the superconductive material.

Various composite bodies of superconductive material in a non-superconductive matrix have been made in an attempt to duplicate the properties of the above-described alloy containing both superconductive and non-superconductive metals. In an early attempt to make improved superconductors, a plurality of glass capillaries were filled with mercury. The thinnest mercury wires obtainable by this method had a radius of about $5 \times 10^{-4}$ centimeters. Another composite superconducting structure is taught in U. S. Pat. No. 3,380,935 issued Apr. 30, 1968 to H. F. Ring. This patent teaches a metal and/or polymer matrix and a superconductor material, in amounts of 20–90 percent by volume of the structure, which is in discontinuous fiber form. A superconducting composite material is disclosed in U. S. Pat. No. 3,447,913 issued June 3, 1969 to G. B. Yntema. This composite material includes a superconductive matrix in which is embedded solid discrete particles of a non-superconducting, non-conducting material.

Until the present invention, it had been thought that the ultimate in superconductive properties were obtainable from superconductors in fibrous or filamentary form. According to the theory of fibrous superconductors, if the fibers are made thinner than the depth to which the magnetic flux can penetrate the superconductive material in bulk form, this fibrous superconductor will remain superconducting in the presence of magnetic fields exceeding the critical field of the bulk superconductor material. This higher critical field is throught to be due to a much deeper flux penetration in a fibrous superconductor. The critical field of discontinuous fibers of some low melting point superconductors such as Pb and Pb alloys can be represented by the equation $$H_{c2}(t) = 3\,\phi_o\,U(t)/2\,\pi\,\xi_o\,d \quad (1)$$

where $t$ is the reduced temperature $T/T_c$, $\phi_o$ is $2 \times 10^{7}$ Gauss cm², $\xi_o$ is the Bardeen, Cooper, Schrieffer coherence length and is dependent upon the particular superconduetive material (for example, the coherence length of lead is $0.83 \times 10^{-5}$ cm and that of indium is $4.4 \times 10^{-5}$cm), $d$ is the average diameter of the superconductive filaments, and the function $U(t)$ is defined by $$\ln(1/t) = -\psi(\tfrac{1}{2}) + \psi(\tfrac{1}{2} + U/4\gamma t) \quad (2)$$

Here, $\psi(x)$ is the logarithmetic derivative of the $\Gamma$ function and $\gamma = e^C = 1.781$, C being Euler's constant. Equation (1) is only applicable to those granular networks having a sufficient degree of interconnection between filaments. The distance between interconnections of filaments must be of the order of $\sqrt{\xi_o d}$ or less.

SUMMARY OF THE INVENTION

It has been discovered that superconductive bodies including grains of superconductive material separated by tunneling barriers exhibit a critical field which is greater than that of superconductive bodies having continuous superconductive filaments by a factor which is related to the electron tunneling barrier between adjacent grains. For granular superconductors disposed within the pores of a non-superconductive porous matrix, a decreased coupling between grains results in a decrease in and a corresponding increase in critical field, the expression for which becomes $$H_{c2}(t) = 3\ \phi_o\ U(t)/2\ {}_o\ d \qquad (3)$$

where $d$ is now the average grain diameter which is assumed to be the same as the measured pore diameter and is an average of the transmission coefficient over the angle of incidence of an electron on the plane of the barrier, or stated in other terms, the probability that an electron arriving at a barrier between grains will pass through the barrier. The transmission coefficient can be obtained from the measured values of the critical field $H_{c2}$(T) and d as follows. The Universal function is fitted to the graph of critical field $H_{c2}$ vs. temperature, $H_{c2}$ being that field at which superconductivity is quenched in the body of the sample. This allows a value of $H_{c2}$(O) to be obtained by extrapolation of the curve to 0°K, From the value of $H_{c2}$(O) can be obtained from equation (3) using the measured value of $d$.

An object of the present invention is to provide a method of making a granular superconductor whereby the electron tunneling between adjacent grains can be changed, thereby changing the critical field of the resultant superconductive body.

Briefly, the composite superconductive body made by the method ofthis invention comprises a matrix of porous glass, the average diameter of the pores being less than 200A. The pores of the matrix contain grains of superconductive material which are spatially separated but which are electrically connected by electron tunneling. In accordance with this invention the superconductive body is made by immersing the matrix in a pool of molten superconductive material and applying hydrostatic pressure to the molten material whereby forcing the same into the pores of the porous glass matrix. The pore size is so small that the superconductive material forms with said pores grains which are spatially separated but electrically connected by electron tunneling. The superconductive material can be conditioned so that the tunneling barriers between adjacent grains is modified. Thereafter, the body so formed is frozen or cooled under pressure to at least room temperature to cause the superconductive material to be retained in the porous glass matrix. Releasing the pressure at any higher temperature produces a degradation of the resultant composite body. The requirement of cooling prior to releasing pressure is more important for smaller diameter pores.

BRIEF DESCRIPTION OF THE DRAWING

The sole FIGURE is a cross-section through a composite superconductive body formed in accordance with the method of the present invention.

DETAILED DESCRIPTION

Referring to FIG. 1 there is shown a granular superconductor 10 including a matrix of porous silica in which are disposed grains of superconductive material. The porous silica matrix consists of particles 12 between which are interstices or pores in which small grains 14 of superconductive material are located. The heavy lines defining the outer surfaces of the grains 14 are representative of tunneling barriers between grains. It is estimated that the distance across the particles of silica is about 100A, the size of the superconductive grains depending on the pore size and usually ranging from about 20A to 100A.

The porous silica matrix is produced in an intermediate step in the production of the high silica glass commonly referred to as 96 percent silica glass. It is usually made by acid leaching a phase-separated alkali-borosilicate glass. The acid leaching step removes a soluble boron-rich phase from the glass and leaves a high silica glass having a multitude of intercommunicating microscopic pores throughout. Typical porous glasses contain 96% $SiO_2$, 3% $B_2O_3$ are small amounts of $Na_2O_3$, $Al_2O_3$ and other oxides. One commercial form of porous glass has an internal surface area of approximately 250 square meters per gram and a pore diameter of approximately 40A. The pore diameter can be controlled to some extent by varying the parameters of the phase separation step and can be increased by etching. The preparation of porous glass is disclosed in U.S. Pat. No. 2,106,744 to Hood and Nordberg.

The grains 14 are formed in the pores of the silica matrix by melting superconductive material, disposing the same adjacent the silica matrix and applying hydrostatic pressure, thereby forcing the molten superconductive material into the pores. Depending upon pore size, the molten superconductive material is subjected to a pressure of 50,000 psi to 100,000 psi. The resultant body is cooled to at least room temperature while pressure is maintained. Inside the silica matrix the superconductive material forms into small grains which are slithgly separated spatially but are connected by electron tunneling. It is estimated that the superconductive grains which are generally less than 100A in diameter are separated by a few angstroms depending upon the particular metal used. The electrical coupling between grains and therefore the transmission coefficient depend upon conditions existing at the time of impregnation including whether the molten superconductive material is exposed to air, the amount of absorbed gas in the molten material, and whether the porous silica matrix is chemically treated prior to impregnation. If the pore diameter were a few hundred angstroms or more, adjacent grains would actually touch, and therefore, the transmission coefficient would be high and the critical field would be low. At some larger pore diameter, continuous metallic filaments would form rather than strings of grains, the transmission coefficient would by unity, and the critical field would then be determined by equation (1).

Electron micrographs are consistent with this idea in that they show a granular system of superconductive material, but the actual details of the relationship between adjacent grains is not revealed due to lack of resolution. There are various factors which indicate that these grains are spatially separated. The critical fields of superconductors in porous glass have been found to have the same temperature dependence as the critical field of a homogeneous dirty alloy. An effective mean free path for electrons in the normal state can be deduced, and it has been found to be proportional to the pore diameter but is much smaller. This is most easily explained if the superconductor consists of grains separated by tunneling barriers, for this gives a mean free path equal to the grain size $d$ multiplied by an average of the transmission coefficient $\tau$ of the barriers. This model can also give a plausible explanation of the large change in critical field produced by chemical treatment of the glass before impregnation with metal, a process which will be hereinafter described.

Table 1 lists the values of critical field $H_{c2}(O)$ and transmission coefficient $\tau$ for various grain sizes of untreated indium, lead, tin and thallium in untreated porous glass. The value $H_{c2}(O)$ is used in Table 1 for comparison purposes.

TABLE 1

| | $d$(A) | $H_{c2}(0)$ (kOe) | $\tau$ |
|---|---|---|---|
| Indium | | | |
| A | 31 | 69 | 0.042 |
| B | 53 | 40 | 0.041 |
| K | 60 | 39 | 0.036 |
| Indium | | | |
| C | 71 | 29 | 0.041 |
| D | 80 | 29 | 0.036 |
| Lead | | | |
| E | 32 | 96 | 0.120 |
| F | 58 | 55 | 0.120 |
| Tin | | | |
| G | 31 | 54 | 0.11 |
| H | 39 | 39 | 0.104 |
| Thalliun | | | |
| I | 32 | 48 | 0.175 |
| J | 58 | 21 | 0.126 |

The data shown in Table 1 indicates that the transmission coefficient $\tau$ is independent of grain diameter. For example, $\tau$ is shown as ranging between 0.036 and 0.042 for indium in untreated porous silica, there being no correlation between grain diameter and $\tau$ in the range of values of $d$ used. The values of $\tau$ for lead and tin are about 0.1, and for thallium about 0.2, indicating that grains of these latter mentioned materials are more strongly coupled than grains of indium.

The values of $\tau$ must depend on the details of the coupling between the beads of metal. The shape of the beads and the contact therebetween must be controlled to a large degree by the energy of the metal-silica interface. Therefore, if the chemical nature of the silica surface were changed prior to impregnation with metal, a different value of $\tau$ would be obtained. The inside, pore defining surface of normally prepared porous silica are covered with OH-groups which can be removed or replaced. This treatment produces little change in the pore diameter or in the transistion temperature, but it changes the critical field. The critical field can also be changed by adding modifying agents to the molten superconductive material prior to the impregnation thereof into the porous silica. The critical fields of indium, lead and lead-bismuth alloy in porous glass have been altered by modifying either the molten superconductor or the porous glass prior to impregnation. Following are examples wherein the critical field has been changed by the above-mentioned methods.

The critical fields of lead and lead-bismuth alloy in porous glass are increased by replacing the OH-groups on the pore surfaces of the glass with Cl-groups prior to impregnation. The inside surfaces of porous glass of the type described in the above-identified Hood and Nordberg patent are covered with OH-groups, the density of which is about 5 per $100(A)^2$. Most of these OH-groups are replaced with Cl-groups by boiling the porous glass for 24 hours under reflux with sulfuryl chloride ($SO_2Cl$) or heating the glass to 200°–300°C in $SO_2Cl$ vapor. The porous glass is then dried by heating it for a few hours in a vacuum furnance the temperature of which is between 150°C and 200°C. Porous glass treated in this manner was impregnated with lead and with lead-bismuth alloy, i.e., Pb-40% Bi. Whereas the critical field of untreated porous glass impregnated with lead was 50 kOe, it increased 20 percent to 60 kOe for lead in chlorinated glass, the measurements being taken at the same temperature. The extrapolated critical field $H_{c2}(0)$ is 105 kOe for lead in untreated 32A pore diameter glass, whereas for lead in chlorinated glass of the same pore diameter, $H_{c2}(O)$ is 120 kOe. A similar test was conducted using the alloy Pb-40% Bi in porous glass. The critical field at 4.2°K was 107 kOe for untreated porous glass impregnated with this alloy and was 125 kOe for chlorinated glass. It appears that (O) the critical field of lead-bismuth alloy in porous glass can be increased by 10 to 15 percent by this chlorination process. When chlorinated porous glass was impregnated with molten indium, the critical field of the resultant granular superconductor was 50 percent than that of indium in non-treated glass.

The critical field of lead in porous glass was also increased 20 percent by adding oxygen to the molten lead prior to impregnation. About equal amounts of lead and lead oxide (PbO) were mixed. Only that lead oxide which actually dissolved in the molten lead can enter the pores of the glass matrix and be effective to alter the boundaries between grains. In one particular example prepared in this manner, wherein the grain diameter $d$ was 32A, the transmission coefficient $\tau$ was determined to be 0.08 rather than the usual 0.1 for untreated lead in porous glass, the critical field being increased by about 20 percent. The addition of powdered indium oxide ($In_2O_3$) to molten indium prior to the impregnation of porous glass therewith caused a reduction in the critical field in the resultant superconductor as compared with the critical field of untreated indium in porous glass. This can be attributed to an increase in the transmission coefficient by 40 percent for the treated indium superconductor.

The critical field of indium was greatly shifted by bubbling hydrogen or oxygen through the molten metal for about 1 hour prior to impregnation. The increase in $\tau$ and the corresponding decrease in critical field can be seen in Table 2.

TABLE 2

| Example | $d$(A) | $H_{c2}(0)$(kOe) | $\tau$ | Treatment |
|---|---|---|---|---|
| N | 32 | 48.4 | 0.058 | $H_2$ |
| O | 32 | 62.4 | 0.045 | $O_2$ |
| A | 31 | 69 | 0.042 | none |

As indicated by Table 2, samples N and O were prepared by bubbling hydrogen and oxygen, respectively, through molten indium prior to impregnation. The critical field of an indium impregnated porous glass superconductor was decreased about 30% by bubbling hydrogen through the molten indium prior to impregnation and was decreased about 10 percent by similarly treating the indium with oxygen. Example A from Table 1 is also included in Table 2 for comparsion purposes. Although the slightly smaller grain diameter of Example A would cause a slight increase in critical field, this example is still useful for illustrating the large change in critical field caused by adding oxygen or hydrogen to the molten indium.

I claim:

1. A method of forming a granular superconductor comprising providing a unitary porous matrix having a pore diameter less than about 200A in diameter, immersing said matrix in a pool of molten superconductive material, applying hydrostatic pressure to said molten material thereby forcing the same into the pores of said porous glass matrix, the pore size being so small that said superconductive material forms within said pores grains which are spatially separated but electrically connected by electron tunneling, conditioning said superconducting material so that the tunneling barriers between adjacent grains is modified, freezing the body so formed under pressure to cause said superconductive material to be retained in said matrix, and removing said hydrostatic pressure.

2. The method of claim 1 wherein said matrix is porous glass and the step of conditioning said superconductive material comprises removing OH-groups from the surfaces of the pores of said porous glass prior to the step of immersing.

3. The method of claim 2 wherein said OH-groups are removed by chlorinating said porous glass matrix.

4. The method of claim 1 wherein the step of conditioning said superconductive material comprises bubbling through said molten material a gas selected from the group consisting of oxygen and hydrogen prior to the step of immersing.

5. The method of claim 1 wherein the step of conditioning said superconductive material comprises mixing a powdered oxide of said superconductive material with said molten material.

* * * * *